United States Patent
Sung et al.

(10) Patent No.: US 11,064,624 B2
(45) Date of Patent: Jul. 13, 2021

(54) FIXING DEVICE

(71) Applicants: Inventec (Pudong) Technology Corporation, Shanghai (CN); INVENTEC CORPORATION, Taipei (TW)

(72) Inventors: Tai-Jung Sung, Taipei (TW); Yi-Hsin Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 88 days.

(21) Appl. No.: 16/713,011

(22) Filed: Dec. 13, 2019

(65) Prior Publication Data
US 2021/0153372 A1  May 20, 2021

(30) Foreign Application Priority Data
Nov. 19, 2019 (CN) .......................... 201911137445.3

(51) Int. Cl.
*H05K 7/00* (2006.01)
*H05K 7/14* (2006.01)
*G06F 1/18* (2006.01)

(52) U.S. Cl.
CPC .......... *H05K 7/1418* (2013.01); *G06F 1/183* (2013.01); *H05K 7/1461* (2013.01)

(58) Field of Classification Search
None
See application file for complete search history.

(56) References Cited

U.S. PATENT DOCUMENTS

| | | | | |
|---|---|---|---|---|
| 5,466,166 A | * | 11/1995 | Law | G06K 7/0047 439/157 |
| 5,692,208 A | * | 11/1997 | Felcman | G06F 1/1616 312/9.29 |
| 5,791,920 A | * | 8/1998 | Tomioka | G06K 13/0806 439/159 |
| 5,846,096 A | * | 12/1998 | Ishida | G06K 13/0806 439/159 |
| 5,871,365 A | * | 2/1999 | Kajiura | G06K 13/0806 439/159 |
| 5,967,810 A | * | 10/1999 | Spickler | G06K 13/08 439/159 |

(Continued)

*Primary Examiner* — Anthony Q Edwards
*Assistant Examiner* — Rashen E Morrison
(74) *Attorney, Agent, or Firm* — CKC & Partners Co., LLC

(57) ABSTRACT

A fixing device includes a base, a fastening assembly, a fixing assembly and a first recovery member. The base has a rail be inserted by a board card. The fastening assembly is movably coupled to the base and detachably secures the board card. The fastening assembly includes a sliding member and a rotation member. The sliding member is slidably connected to the base. The rotation member is pivotally connected to the sliding member and includes an abutting end and a latch end. The rotation member selectively causes the abutting end and the latch end to be inserted into the rail. The fixing assembly is connected to the base and the fastening assembly, and secures the fastening assembly in a locked status. The first recovery member moves the fastening assembly from the fixed position toward an entrance of the rail when the locked status is released.

10 Claims, 5 Drawing Sheets

(56) References Cited

U.S. PATENT DOCUMENTS

| | | | | |
|---|---|---|---|---|
| 5,967,812 | A * | 10/1999 | Tung | G06K 13/0806 |
| | | | | 439/159 |
| 6,010,344 | A * | 1/2000 | Muramatsu | G06K 13/08 |
| | | | | 439/159 |
| 6,030,238 | A * | 2/2000 | Dong | G06K 13/08 |
| | | | | 439/159 |
| 6,074,227 | A * | 6/2000 | Ho | G06K 13/0825 |
| | | | | 439/159 |
| 6,102,719 | A * | 8/2000 | Tung | H01R 13/6335 |
| | | | | 439/159 |
| 6,288,911 | B1 * | 9/2001 | Aoki | H05K 7/1409 |
| | | | | 211/41.17 |
| 6,367,700 | B1 * | 4/2002 | Kanayama | G06K 7/0021 |
| | | | | 235/441 |
| 6,570,759 | B1 * | 5/2003 | Chien | G06F 1/1616 |
| | | | | 361/679.34 |
| 6,587,350 | B1 * | 7/2003 | Lin | H05K 7/1411 |
| | | | | 361/754 |
| 6,616,050 | B1 * | 9/2003 | Oki | G06K 7/0021 |
| | | | | 235/441 |
| 6,619,971 | B1 * | 9/2003 | Chen | G06K 7/0047 |
| | | | | 439/159 |
| 6,978,903 | B2 * | 12/2005 | Son | G06F 1/184 |
| | | | | 211/26 |
| 10,402,705 | B2 * | 9/2019 | Mizawa | G06K 13/085 |
| 2015/0237749 | A1 * | 8/2015 | Boetzer | G06F 1/186 |
| | | | | 403/322.4 |
| 2020/0253082 | A1 * | 8/2020 | Yu | H05K 7/183 |

* cited by examiner

FIXING DEVICE

CROSS-REFERENCE TO RELATED APPLICATION

This application claims priority to China Application Serial Number 201911137445.3, filed Nov. 19, 2019, which is herein incorporated by reference in its entirety.

BACKGROUND

Field of Invention

The present disclosure relates to a fixing device, and more particularly to a fixing device for automatically ejecting a board card.

Description of Related Art

There are many types of fixing devices on the market. Some fixing devices include rails to insert board cards. The fixing devices then utilize their fixing components to secure the board cards within the rails thereof, thereby ensuring the stability of the board cards.

However, the fixed component may block an insertion path of the board card such that the fixed component must be removed before inserting the card, and utilizing the fixed component to fasten the card after inserting the card. While removing the card, the fixed component needs to be removed from the card first, and then the card can be manually removed. In addition, when the fixing device is shaken, the fixing component may also fall off, thereby causing the card to fall out.

From the above, it can be known that after inserting the board card, the user may forget to fix the board card with the fixing component, thereby causing the board card to fall out in the operating state. Shaking the fixing device may also cause the fixing component to fall off. Moreover, the above-mentioned fixing steps and removing steps are quite complicated and inconvenient for users.

SUMMARY

One aspect of the present disclosure is to provide a fixing device that includes a base, a fastening assembly, a fixing assembly and a first recovery member. The base has a rail configured to be inserted by a board card. The fastening assembly is movably coupled to the base and configured to detachably secure the board card that is inserted into the rail. The fastening assembly includes a sliding member and a rotation member. The sliding member is slidably connected to the base. The rotation member is pivotally connected to the sliding member and includes an abutting end and a latch end opposite to the abutting end, wherein the rotation member is configured to swing and selectively cause the abutting end and the latch end to be inserted into the rail. The fixing assembly connected to the base and the fastening assembly, and configured to secure the fastening assembly to be in a locked status relative to the base so as to cause the fastening assembly located at a fixed position. The first recovery member is configured to move the fastening assembly from the fixed position toward an entrance of the rail when the locked status is released.

In one or more embodiments, the first recovery member is connected between the base and the fastening assembly.

In one or more embodiments, the latch end is located between the abutting end and the entrance of the rail.

In one or more embodiments, the fixing device further includes a second recovery member connected to the base and configured to apply a force to the rotation member to move the abutting end toward the rail and move the latch end away from the rail.

In one or more embodiments, the base includes a first retaining member, and the fixing assembly includes a connection member connected to a first pivot joint of the base and a second pivot joint of the fastening assembly, and configured to adjust a distance between the first pivot joint and the second pivot joint; and a locking member connected to the connection member and having a second retaining member configured to interlock with the first retaining member.

In one or more embodiments, the first retaining member is a concave groove, the second retaining member is a hook, and the hook interlocks with the concave groove.

In one or more embodiments, the connection member includes a first connection rod having an end pivotally connected to the first pivot joint; and a second connection rod having two opposite ends pivotally connected to an opposite end of the first connection rod and the second pivot joint, respectively.

In one or more embodiments, the locking member is pivotally connected to at least one of the first connection rod and the second connection rod.

In one or more embodiments, the locking member further includes a handle configured to allow applying an external force to turn the locking member.

In one or more embodiments, the fixing device further includes a buffer member connected between the first connection rod and the second connection rod.

In summary, the fixing device of the present invention has its the fasting assembly configured to automatically secure the board card during the process of inserting the board card into the rail of the base and configured to automatically release the board card during the process of ejecting the board card from the rail of the base. Therefore, users can simply push the board card into the rail to fix the board card to the fastening assembly, and easily remove the board card from the fastening assembly (during ejecting the board card from the rail). The first recovery member connected between the base and the fasting assembly is configured to reset the fasting assembly so as to achieve the effect of automatically ejecting the board card from the rail of the base. The fixing assembly is configured to maintain the position of the fasting assembly relative to the base, and configured to interlock with the base such that the position of the board card relative to the base can be fixed after the board card is inserted into the rail of the base.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
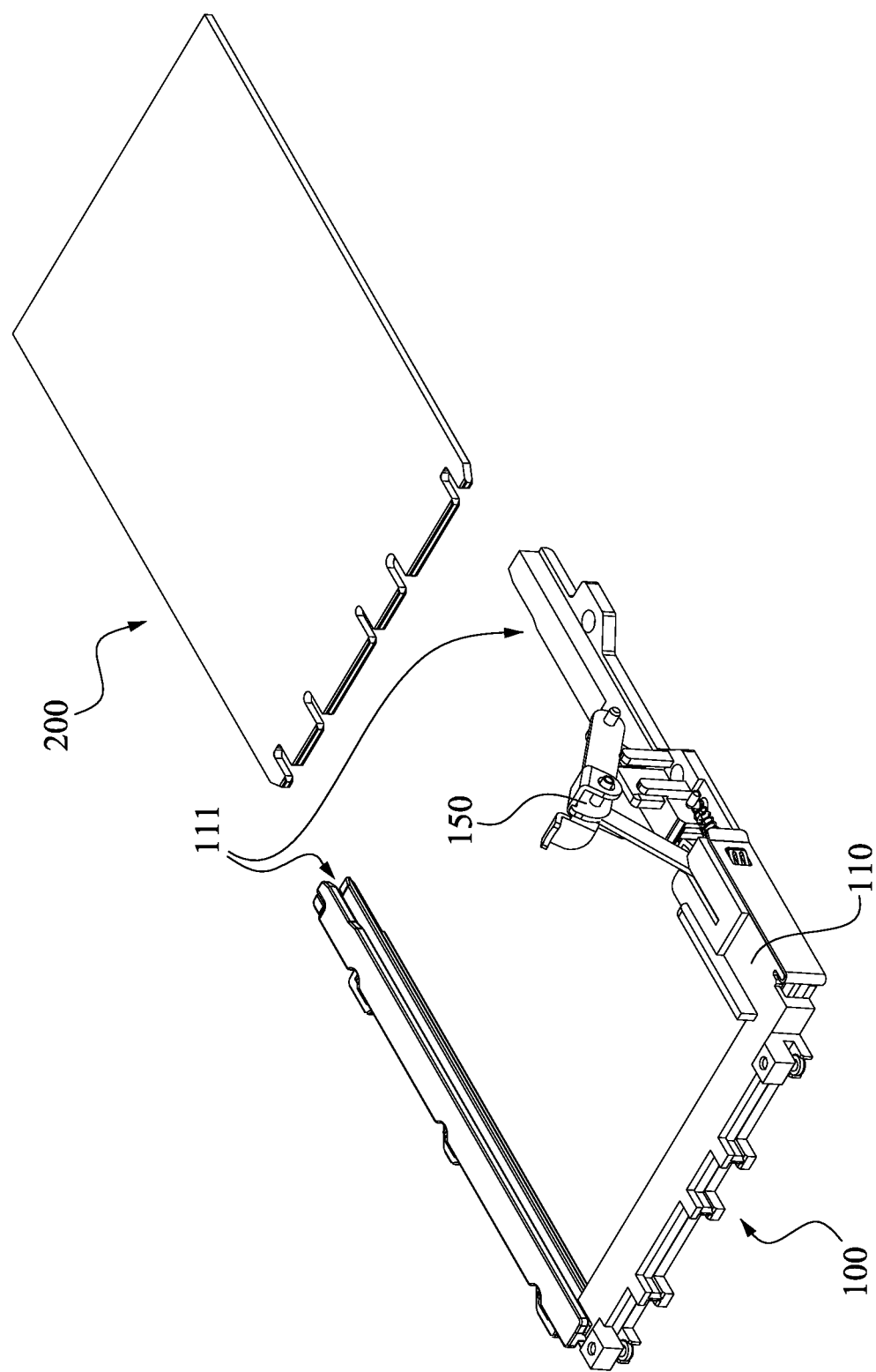
FIG. 1 illustrates a perspective view of a fixing device and a board card in accordance with one embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Reference is made to FIG. 1, which illustrates a perspective view of a fixing device 100 and a board card 200 in accordance with one embodiment of the present disclosure. The fixing device 100 includes a base 110, a rail 111 and a fixing assembly 150. The board card 200 can be inserted into or removed from the rail 111 of the base 110. The fixing device 100 is configured to secure the board card 200 to the base 110, and its detailed structure and operation method is detailed in the following.

Figure 2:
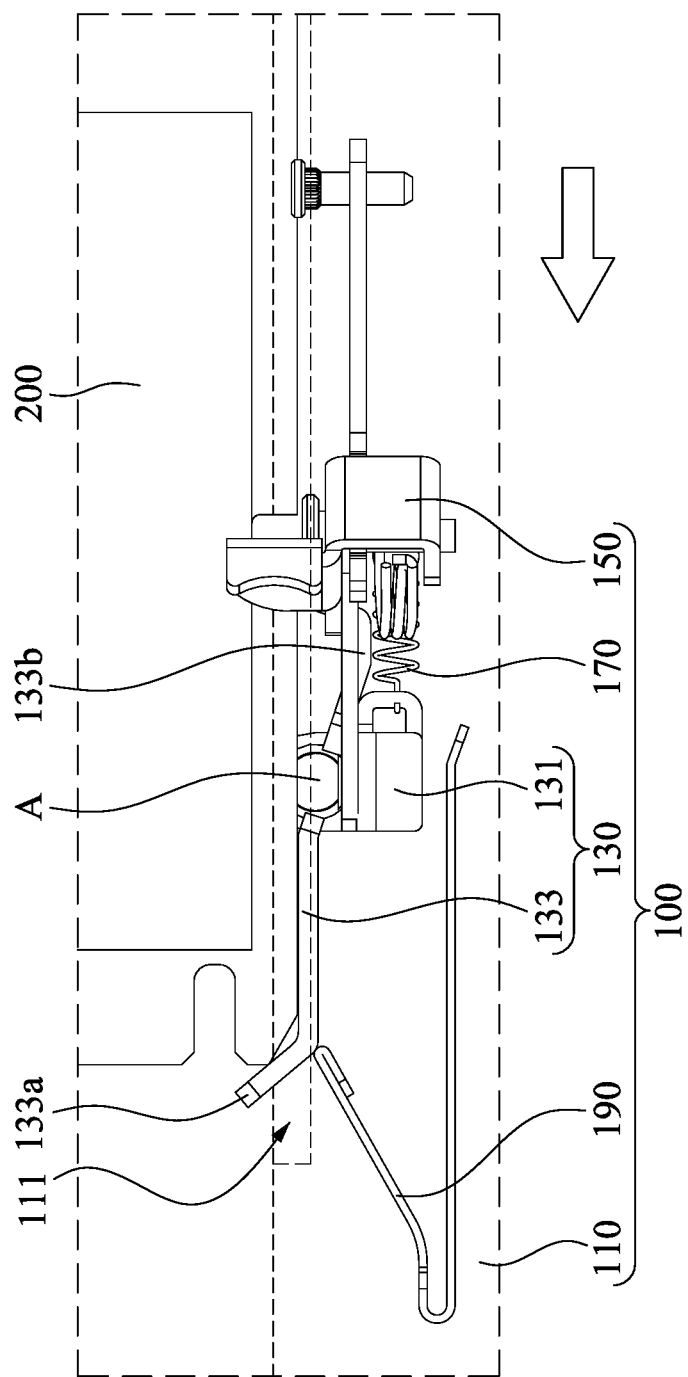
FIG. 2 illustrates an enlarged partial view of the fixing device in FIG. 1, wherein the board card is not yet fixed by the fastening assembly.
Figure 3:
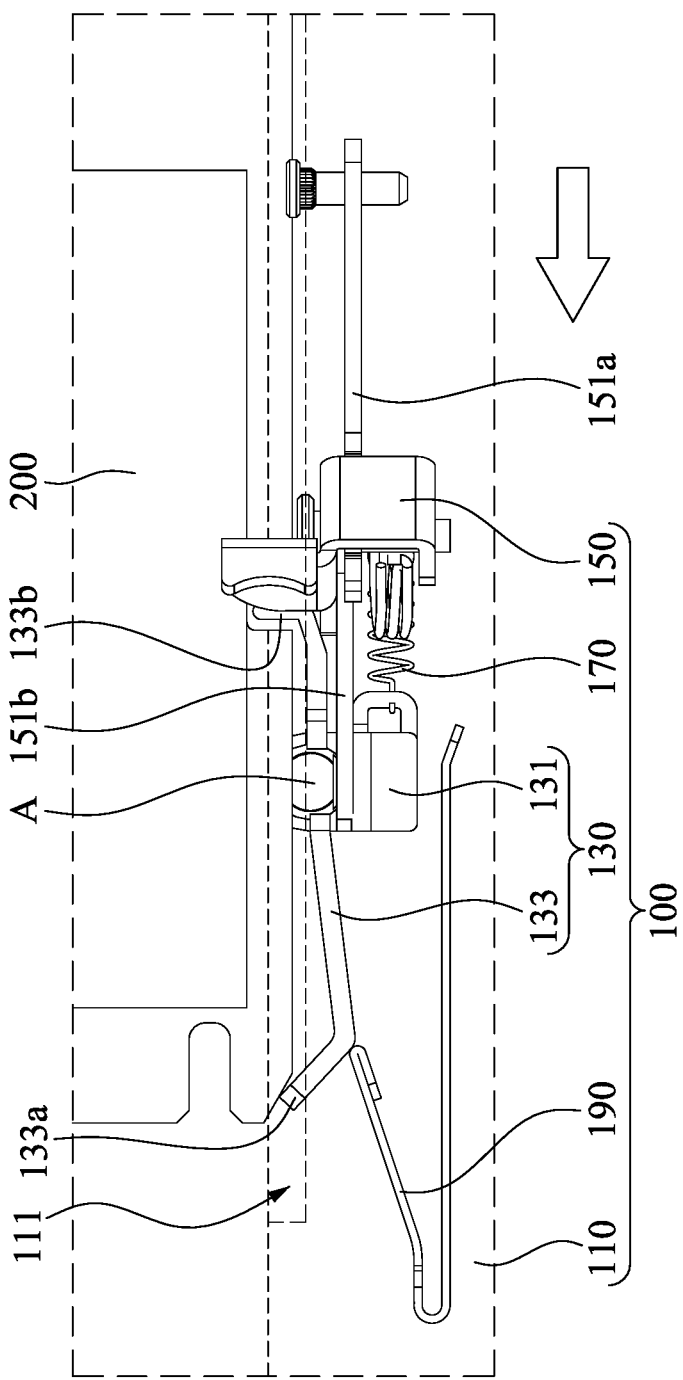
FIG. 3 illustrates another enlarged partial view of the fixing device in FIG. 1, wherein the board card is firmly fixed by the fastening assembly.

Reference is made to FIGS. 2 and 3, the base 110 is shown in perspective, i.e., with dashed line portions, to facilitate understanding of the position of other components inside the base 110. The arrow indicates the direction in which the board card 200 is inserted into the fixing device 100. In this embodiment, the fixing device 100 further includes a first recovery member 170. A fastening assembly 130 is movably connected to the base 110 and configured to detachably secure the board card 200 inserted into the rail 111. The fixing assembly 150 is connected to the base 110 and the fastening assembly 130, and configured to be a lock status relative to the base 110 such that the fastening assembly 130 can be fixed relative to the base 110 at a fixed position as shown in FIG. 3. The first recovery member 170 is configured to pull the fastening assembly 130 from the fixed position toward an entrance of the rail 111 during a release status, i.e., move the fastening assembly 130 from the position shown in FIG. 3 to the position shown in FIG. 2). In this embodiment, the first recovery member 170 is connected to the base 110 and the fastening assembly 130. In this embodiment, the first recovery member 170 can be a tension or compression spring, but not being limited thereto.

Referring FIGS. 2 and 3 again, in this embodiment, the fastening assembly 130 includes a sliding member 131 and a rotation member 133. The sliding member 131 is slidably connected to the base 110. In order to accurately restrict a moving path of the sliding member 131, the sliding member 131 is slidably connected to the base 110 by a slide rail (not shown) and moves relative to the base 110 via the slide rail. The rotation member 133 is pivotally connected to the sliding member 131, and includes an abutting end 133a and a latch end 133b opposite to the abutting end 133a. The rotation member 133 is configured to swing or rotate to selectively cause the abutting ends 133a and the buckling ends 133b to insert or leave the rail 111. Specifically, the latch end 133b is located between the abutting end 133a and the entrance of the rail 111.

Reference is made to FIGS. 2 and 3 again. Specifically, when the user inserts the board card 200 into the rail 111 in the direction indicated by the arrow, the board card 200 will be pushed towards the abutting end 133a, thereby causing the rotation member 133 to drive the abutting end 133a to leave the rail 111 and drive the latch end 133b to insert the rail 111 respectively based on the rotation of the rotation shaft A. Therefore, the latch end 133b of the rail 111 engages a concave slot of the board card 200. By engaging the latch end 133b to the board card 200, the user may further push the latch end 133b by the board card 200 to make the fastening assembly 130 to be at the aforementioned fixed position relative to the base 110 so as to achieve the result of utilizing the fastening assembly 130 to automatically fix the board card 200. Then, the fixing assembly 150 and the base 110 can be fixed to cause the board card 200 to be in a locked status. In the process of inserting board card 200 into the rail 111 and fixed by the fixing assembly 150 and the base 110, the first recovery member 170 can store elastic potential energy.

Reference is made to FIGS. 2 and 3 again. In this embodiment, the fixing device 100 may further include a second recovery member 190. The second recovery member 190 is connected to the base 110 and configured to apply a force to the abutting end 133a of the rotation member 133 to move the abutting end 133a toward the rail 111 and move the latch end 133b away from the rail 111, respectively. With the configuration of the second recovery member 190, the latch end 133b will not enter the rail 111 when the board card 200 is inserted into the rail 111. And the latch end 133b will not enter the rail 111 until the board card 200 is inserted into the rail 111 to push the abutting end 133a away from the rail 111, thereby effectively preventing the latch end 133b from causing obstacles during the insertion of the board card 200 into the rail 111. In this embodiment, the second recovery member 190 may be a resilient metallic member, but not being limited thereto. The second recovery member 190 can store the elastic potential energy during the process of inserting the board card 200 into the rail 111 and fixed by the fixing assembly 150 to the base 110.

Reference is made to FIGS. 2 and 3 again. After the fixing assembly 150 is released from the base 110, the first recovery member 170 can drive the fastening assembly 130 from the fixed position toward the entrance of the rail 111 by releasing the potential energy, thereby ejecting the board card 200 out of the fixing device 100. The second recovery member 190 releases the elastic potential energy to push the rotation member 133 to swing or rotate about the rotation shaft A such that the abutting end 133a moves toward the rail 111 to abut the board card 200, and the latch end 133b moves away from the rail 111 and separates from the board card 200. It can be known that the configuration of the first recovery member 170 can achieve the effect of automatically ejecting the board card 200 out of the fixing device 100. With the foregoing configuration of the second recovery member 190, it can achieve the effect of automatically releasing the fastening assembly 130 from the board card 200.

Figure 4:
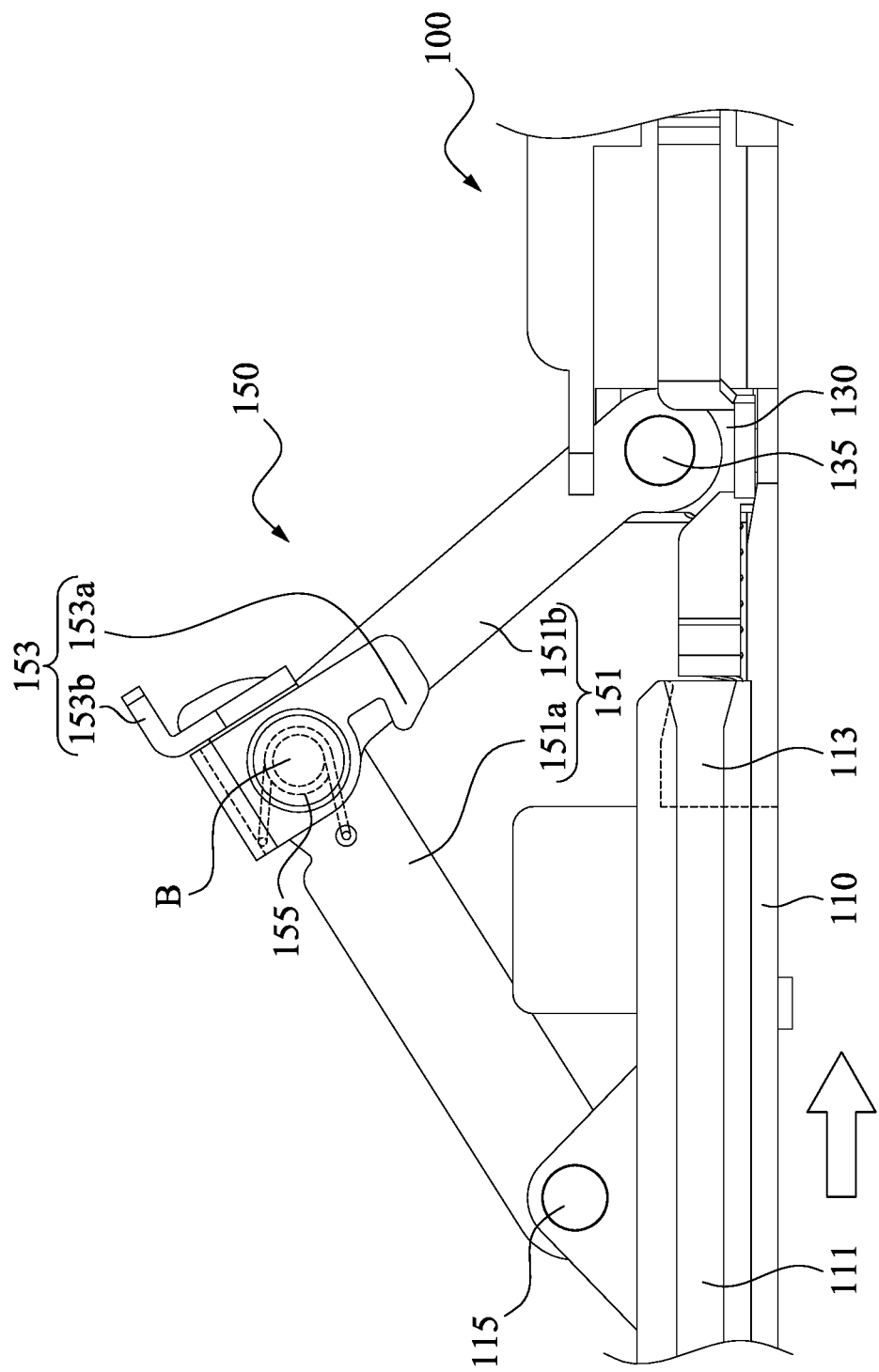
FIG. 4 illustrates an enlarged side view of the fixing device in FIG. 1.
Figure 5:
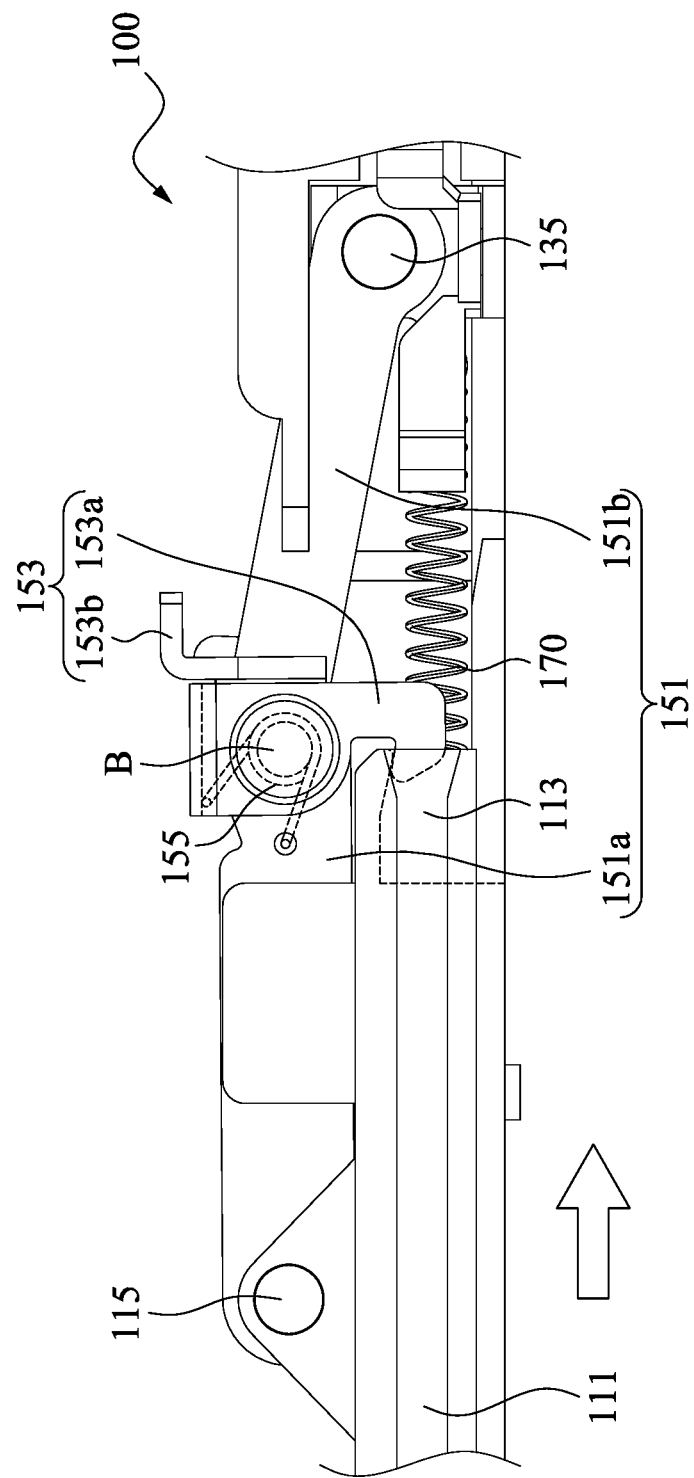
FIG. 5 illustrates another enlarged side view of the fixing device in FIG. 1, wherein the fixing assembly is secured in a lock status relative to the base.

Reference is made to FIGS. 4 and 5. The dash-line illustrated portions indicate the internal structure of the fixing device 100, and the arrow indicates the direction in which the board card 200 is inserted into the fixing device 100. In the foregoing embodiments, the base 110 further includes a first pivot joint 115, and the fastening assembly 130 further includes a second pivot joint 135. The fixing assembly 150 includes a connection member 151 that is connected to the base 110 by the first pivot joint 115 and connected to the fastening assembly 130 by the second pivot joint 135. Because the fastening assembly 130 is slidably connected to the base 110, the connection member 151 is configured to move the fastening assembly 130 relative to the base 110 by adjusting its appearance, i.e., adjusting a distance between the first pivot joint 115 and the second pivot joint 135.

Reference is made to FIGS. 4 and 5 again. In the foregoing embodiments, the base 110 further includes a first retaining member 113. The fixing assembly 150 also includes a locking member 153. The lock member 153 includes a second retaining member 153a and is connected to the connection member 151. The second retaining member 153a is configured to engage and lock the first retaining member 113. Specifically, the first retaining member 113 is a concave groove, the second retaining member 153a is a hook, and the hook can engage and interlock with the groove, but not being limited thereto. With the configuration of the first retaining member 113 and the second retaining member 153a, users can choose to fix or separate the fixing assembly 150 and the base 110 from each other. After being fixed, the connection member 151 cannot be deformed, thereby maintaining the distance between the two pivot joints (115, 135) such that the fastening assembly 130 is located at the fixed position, e.g., as illustrated in FIG. 3.

Reference is made to FIGS. 4 and 5 again. In the foregoing embodiments, the connection member 151 includes a first connection rod 151a and a second connection rod 151b. The first connection rod 151a is pivotally connected to the first pivot joint 115 at one end. Two opposite ends of the second connection rod 151b are pivotally connected to the other end of the first connection rod 151a and the second pivot joint 135, respectively.

Specifically, with the foregoing configuration, the connection member 151 can be deformed such that the first connection rod 151a and the second connection rod 151b swing toward or away from the base 110, thereby changing the distance between the first pivot joint 115 and the second pivot joint 135 so as to drive the fastening assembly 130 relative to the base 110 to the fixed position or toward the entrance of the rail 111.

Reference is made to FIGS. 4 and 5 again. In the foregoing embodiments, the locking member 153 is pivotally connected to at least one of the first connection rod 151a and the second connection rod 151b, and rotates about the rotation shaft B. The locking member 153 includes a handle 153b that is configured to allow a user to turn or apply a force to the locking member 153 with his or her finger such that the first retaining member 113 and the second retaining member 153a can be interlocked or separated from each other, and the fixing assembly 150 and the base 110 can be thus interlocked or separated from each other.

Reference is made to FIGS. 4 and 5 again. In the foregoing embodiment, a buffer member 155 is connected between the first connection rod 151a and the second connection rod 151b. Specifically, the buffer member 155 may be a torsion spring that has one end connected to the first connection rod 151a and the other end connected to the second connection rod 151b. When the first recovery member 170 is elastically restored, and the first pivot joint 115 and the second pivot joint 135 approach each other, the buffer member 155 is configured to avoid the first connection rod 151a and the second connection rod 151b from swinging too quickly, thereby causing the fixing device 100 to vibrate and damage its structure.

In summary, the fixing device of the present invention has its the fasting assembly configured to automatically secure the board card during the process of inserting the board card into the rail of the base and configured to automatically release the board card during the process of ejecting the board card from the rail of the base. Therefore, users can simply push the board card into the rail to fix the board card to the fastening assembly, and easily remove the board card from the fastening assembly (during ejecting the board card from the rail). The first recovery member connected between the base and the fasting assembly is configured to reset the fasting assembly so as to achieve the effect of automatically ejecting the board card from the rail of the base. The fixing assembly is configured to maintain the position of the fasting assembly relative to the base, and configured to interlock with the base such that the position of the board card relative to the base can be fixed after the board card is inserted into the rail of the base.

It can be known from the disclosed embodiments that the fastening assembly may include a sliding member and a rotation member. The sliding member is slidably connected to the base. The rotation member is pivotally connected to the sliding member and selectively abuts or separates the board card. With this regard, after the board card is fixed by the rotation member, the board card can be moved along with the fastening assembly relative to the base. The second recovery member is connected to the base and configured to apply a force to the rotation member so that it tends to separate from the board card to achieve the effect of automatically ejecting the board card. The locking member is pivotally connected to the first connection rod or the second connection rod, in order to adjust the fixed relationship between the base and the fixing assembly, and the locking member can be used to fix the connection member to the base, so that the base and the fixing assembly are locked, thereby enabling the fasting assembly located in a fixed position. The locking member may have a handle that is configured to be rotated by an external force to switch both the locking member and the base between a locked state and an unlocked state. The first connection rod and the second connection rod are connected to a buffer member configured to avoid the vibration of the fixing device when the board card is ejected from the base.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A fixing device comprising:
   a base having a rail configured to be inserted by a board card;
   a fastening assembly movably coupled to the base and configured to detachably secure the board card that is inserted into the rail, wherein the fastening assembly includes:
   a sliding member slidably connected to the base; and a rotation member pivotally connected to the sliding member and including an abutting end and a latch end opposite to the abutting end, wherein the rotation member is configured to swing and selectively cause the abutting end and the latch end to be inserted into the rail;

a fixing assembly connected to the base and the fastening assembly, and configured to secure the fastening assembly to be in a locked status relative to the base so as to cause the fastening assembly located at a fixed position; and a first recovery member configured to move the fastening assembly from the fixed position toward an entrance of the rail when the locked status is released.

2. The fixing device of claim 1, wherein the first recovery member is connected between the base and the fastening assembly.

3. The fixing device of claim 1, wherein the latch end is located between the abutting end and the entrance of the rail.

4. The fixing device of claim 1 further comprising a second recovery member connected to the base and configured to apply a force to the rotation member to move the abutting end toward the rail and move the latch end away from the rail.

5. The fixing device of claim 1, wherein the base includes a first retaining member, the fixing assembly comprises:

a connection member connected to a first pivot joint of the base and a second pivot joint of the fastening assembly, and configured to adjust a distance between the first pivot joint and the second pivot joint; and a locking member connected to the connection member and having a second retaining member configured to interlock with the first retaining member.

6. The fixing device of claim 5, wherein the first retaining member is a concave groove, the second retaining member is a hook, and the hook interlocks with the concave groove.

7. The fixing device of claim 5, wherein the connection member comprises:

a first connection rod having an end pivotally connected to the first pivot joint; and a second connection rod having two opposite ends pivotally connected to an opposite end of the first connection rod and the second pivot joint, respectively.

8. The fixing device of claim 7, wherein the locking member is pivotally connected to at least one of the first connection rod and the second connection rod.

9. The fixing device of claim 8, wherein the locking member further includes a handle configured to allow applying an external force to the locking member.

10. The fixing device of claim 7 further comprising a buffer member connected between the first connection rod and the second connection rod.

* * * * *